United States Patent
Jeong

(10) Patent No.: US 9,336,902 B2
(45) Date of Patent: May 10, 2016

(54) SEMICONDUCTOR MEMORY DEVICE, TEST CONTROL SYSTEM, AND METHOD OF OPERATING TEST CONTROL SYSTEM

(71) Applicant: SK hynix Inc., Icheon-si, Gyeonggi-do (KR)

(72) Inventor: Seung-Geun Jeong, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 14/467,395

(22) Filed: Aug. 25, 2014

(65) Prior Publication Data

US 2015/0206601 A1   Jul. 23, 2015

(30) Foreign Application Priority Data

Jan. 21, 2014   (KR) .................. 10-2014-0007172

(51) Int. Cl.
| | |
|---|---|
| *G11C 29/00* | (2006.01) |
| *G11C 29/02* | (2006.01) |
| *G11C 29/20* | (2006.01) |
| *G11C 29/46* | (2006.01) |
| *G11C 29/48* | (2006.01) |
| *G11C 29/50* | (2006.01) |
| *G11C 29/34* | (2006.01) |
| *G11C 29/12* | (2006.01) |

(52) U.S. Cl.
CPC .............. *G11C 29/025* (2013.01); *G11C 29/20* (2013.01); *G11C 29/34* (2013.01); *G11C 29/46* (2013.01); *G11C 29/48* (2013.01); *G11C 29/50* (2013.01); *G11C 2029/1202* (2013.01); *G11C 2029/5004* (2013.01)

(58) Field of Classification Search
CPC ........ G11C 29/50; G11C 29/02; G11C 29/34; G11C 29/48; G11C 29/46
USPC .................................... 365/201, 241
See application file for complete search history.

(56) References Cited

U.S. PATENT DOCUMENTS

| | | | | |
|---|---|---|---|---|
| 6,269,036 B1* | 7/2001 | Shubat | .................. | G11C 7/1075 365/201 |
| 6,580,649 B2* | 6/2003 | Park | .................. | G11C 8/14 365/189.07 |
| 7,139,204 B1* | 11/2006 | Behera | .................. | G11C 29/16 365/201 |
| 8,780,617 B2* | 7/2014 | Kang | .................. | G11C 5/06 365/158 |
| 8,958,258 B2* | 2/2015 | Okuma | .................. | G11C 8/14 365/201 |

FOREIGN PATENT DOCUMENTS

KR   1020050117059 A   12/2005

* cited by examiner

*Primary Examiner* — Pho M Luu
(74) *Attorney, Agent, or Firm* — William Park & Associates Ltd.

(57) ABSTRACT

A semiconductor memory device includes a plurality of memory cells electrically coupled to a plurality of word lines and a word line failure detection unit suitable for supplying a test voltage to a test target word line selected from among the plurality of word lines, and for detecting the test voltage transferred from at least one of the plurality of word lines, wherein the at least one of the plurality of word lines does not include the test target word line.

8 Claims, 5 Drawing Sheets

SEMICONDUCTOR MEMORY DEVICE, TEST CONTROL SYSTEM, AND METHOD OF OPERATING TEST CONTROL SYSTEM

CROSS-REFERENCE TO RELATED APPLICATIONS

The present application claims priority of Korean Patent Application No. 10-2014-0007172, filed on Jan. 21, 2014, which is incorporated herein by reference in its entirety.

BACKGROUND

1. Field

Various embodiments relate to a semiconductor design technology, and more particularly, to a semiconductor memory device, a test control system, and a method of operating a test control system.

2. Description of the Related Art

Semiconductor memory devices are generally divided into two types of memory devices, volatile memory devices and non-volatile memory devices. Examples of volatile memory devices include, but are not limited to, a Dynamic Random Access Memory (DRAM) device, and a Static Random Access Memory (SRAM) device. Examples of non-volatile memory devices include, but are not limited to, a Programmable Read Only Memory (PROM) device, an Erasable PROM (EPROM), an Electrically EPROM (EEPROM), and a flash memory device. A volatile memory device can be distinguished from a non-volatile memory device based on whether the data stored in the memory cells are retained when power supply is cut off. The volatile memory device does not retain the data stored in the volatile memory device memory cells when power supply is cut off, whereas the non-volatile memory device retains the data stored in the non-volatile memory device memory cells when the power supply is cut off. Volatile memory devices typically include additional circuitry for retaining the data stored in its memory cells.

Increases in the degree of integration of the semiconductor memory devices has resulted in decreases in the size of the memory bank. Decreases in the size of the memory bank has led to relatively shorter distances between word lines coupled to adjacent memory cells. Referring to FIG. 1 a circuit diagram representation of a section of an example of a prior art flash memory device is shown.

The semiconductor memory device includes a plurality of memory cells 110 for storing data. The plurality of memory cells 110 are electrically coupled in series between a bit line BL and a source line SL. A drain selection transistor DST is electrically coupled between the plurality of memory cells 110 and the bit line BL, and electrically couples the plurality of memory cells 110 with the bit line BL in response to a signal received via a drain selection line DSL. A source selection transistor SST is electrically coupled between the plurality of memory cells 110 and the source line SL, and electrically couples the plurality of memory cells 110 with the source line SL in response to a signal received via a source selection line SSL. Each of the plurality of memory cells 110 is electrically coupled to a corresponding one of a plurality word lines WL1-WLn, where n is a nature number. The plurality word lines WL1-WLn are used to read data from and write data to the plurality of memory cells and are driven to predetermined voltage levels during the performance of a write operation or a read operation.

As the distance between adjacent word lines decreases with advances in technology, a word line may improperly electrically couple to an adjacent word line and impact the performance of the memory cells that are electrically coupled to such word lines.

SUMMARY

In an embodiment, a semiconductor memory device may include a plurality of memory cells electrically coupled to a plurality of word lines, and a word line failure detection unit suitable for supplying a test voltage to a test target word line selected from among the plurality of word lines, and for detecting the test voltage transferred from at least one of the plurality of word lines, wherein the at least one of the plurality of word lines does not include the test target word line.

In an embodiment, a test control system may include a semiconductor memory device and a test control circuit. The semiconductor memory device may include a memory bank including a plurality of word lines and a word line failure detection unit suitable for supplying a test voltage to at least one first test target word line from among the plurality of word lines, and for detecting the test voltage through at least one second test target word line from among the plurality of word lines. The test control circuit may be suitable for selecting the at least one first test target word line and the at least one second test target word line.

In an embodiment, a method of operating a test control system may include supplying first and second test voltages to at least two test target word lines selected from among a plurality of word lines, detecting the first and second test voltages through the plurality of word lines, and obtaining failure information on a status of electrical coupling between at least two of the plurality of word lines based on the detected first and second test voltages.

DETAILED DESCRIPTION

Figure 1:
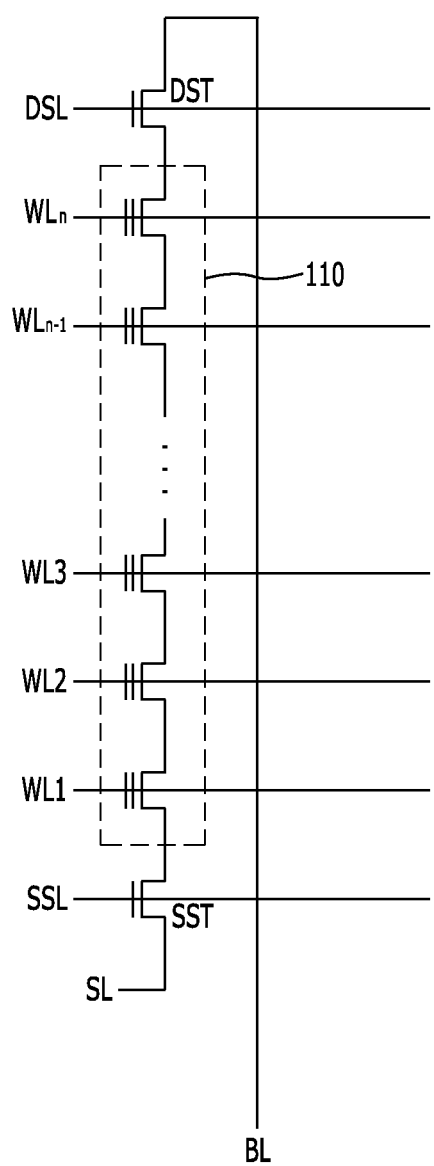
FIG. 1 is a circuit diagram representation of a section of a prior art flash memory device.

Various embodiments will be described below with reference to the accompanying drawings. The drawings are not necessarily to scale and in some instances, proportions may have been exaggerated in order to clearly illustrate features of the embodiments. Throughout the disclosure, reference numerals correspond like numbered parts in the various figures and embodiments. In addition, a singular form may include a plural form as long as it is not specifically mentioned in a sentence.

Figure 2:
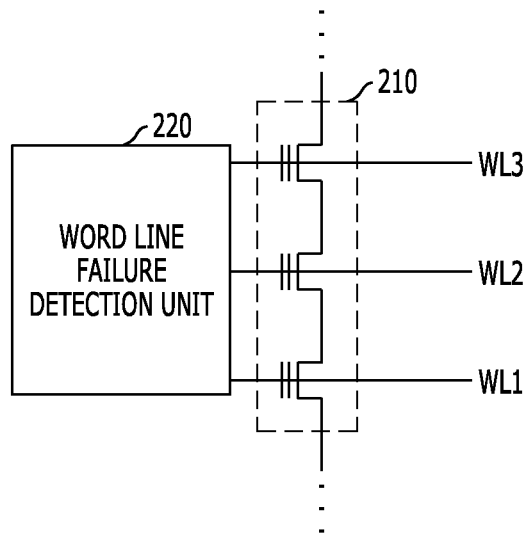
FIG. 2 is a block diagram representation of an embodiment of a semiconductor memory device.

Referring to FIG. 2 a block diagram representation of an embodiment of a semiconductor memory device is shown.

The semiconductor memory device includes a plurality of memory cells 210 and a word line failure detection unit 220.

The plurality of memory cells 210 are configured to store data. Each of the plurality of memory cells 210 is electrically coupled to a corresponding one of a plurality of word lines. While three memory cells 210 and three word lines WL1, WL2, WL3 are shown in FIG. 2, the semiconductor memory device may include a greater number of memory cells and word lines. Each of the three memory cells 210 is associated with a corresponding word line WL1, WL2, WL3. The word line failure detection unit 220 supplies a test voltage to one of the three word lines WL1, WL2, WL3. The word line supplied with the test voltage is a test target word line. The word failure detection unit 220 detects the test voltage transferred through the first, second and third word lines WL1, WL2, WL3.

An embodiment of the semiconductor memory device may detect issues relating to an improper electrical coupling between the first, second and/or third word lines WL1, WL2, WL3 by detecting the test voltage after supplying the test voltage to the test target word line through the plurality of word lines during a test operation.

Figure 3:
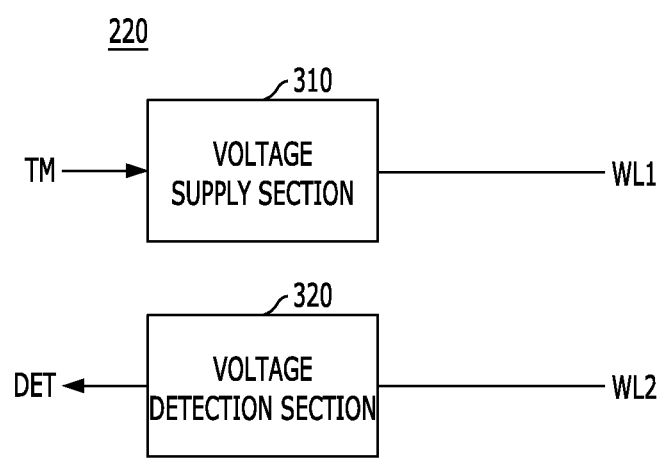
FIG. 3 is a block diagram representation of an embodiment of the word line failure detection unit shown in FIG. 2.

FIG. 3 is a block diagram representation of the word line failure detection unit 220 shown in FIG. 2. For convenience of description, the first word line WL1 is designated as a test target word line.

The word line failure detection unit 220 includes a voltage supply section 310 and a voltage detection section 320.

The voltage supply section 310 supplies a test voltage having a predefined voltage level to the first word line WL1 in response to a test signal TM. The test signal TM is activated during a test operation. The voltage detection section 320 detects the test voltage transferred through the second word line WL2 and generates a detection signal DET. The detection signal DET includes information regarding whether the first word line WL1 is improperly electrically coupled to the second word line WL2.

In FIG. 3, the first word line WL1 is designated as the test target word line and the second word line WL2 is disposed adjacent to the first word line WL1. When the second word line WL2 is designated as the test target word line, the voltage detection section 320 may detect the test voltage transferred through the first word line WL1 and/or the third word line WL3.

Figure 4:
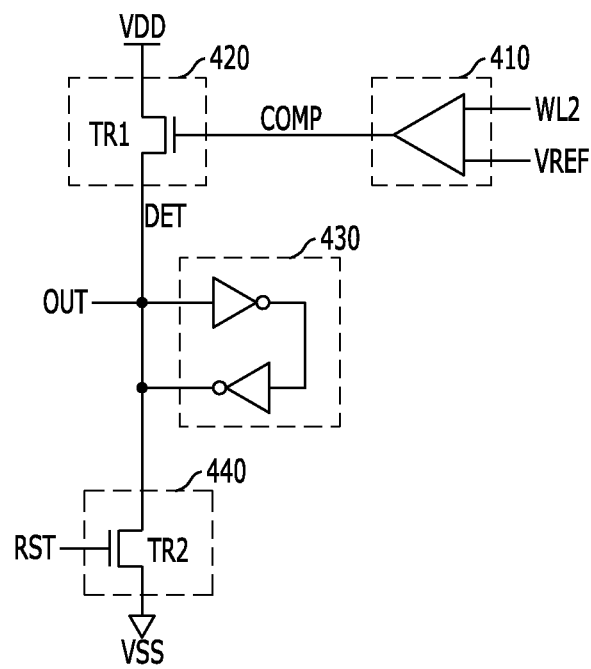
FIG. 4 is a circuit diagram representation of a voltage detection section shown in FIG. 3.

FIG. 4 is a circuit diagram representation of the voltage detection section 320 shown in FIG. 3.

The voltage detection section 320 includes a comparator 410, a driver 420, a storage unit 430 and a reset unit 440.

The comparator 410 compares the test voltage transferred through the second word line WL2 with a reference voltage VREF and generates an output signal COMP. The driver 420 includes a first NMOS transistor TR1. The driver 420 drives an output node OUT in response to the output signal COMP received from the comparator 410 and generates the detection signal DET at the output node OUT. The storage unit 430 is electrically coupled to the output node OUT and stores the output signal generated by the driver 420. The output signal generated by the driver 420 is the detection signal DET. The reset unit 440 includes a second NMOS transistor TR2. The reset unit 440 resets the storage unit 430 in response to a reset signal RST.

An example of an operation of the semiconductor memory device is described below with reference to FIG. 3 and FIG. 4. In this example, the first word line WL1 of FIG. 3 is designated as the test target word line, and the first word line WL1 is improperly electrically coupled to the second word line WL2 as a result of a failure.

Referring to FIG. 3, the voltage supply section 310 supplies the test voltage to the test target word line, the first word line WL1, in response to the test signal TM during the test operation. The test voltage is transferred to the second word line WL2 from the first word line WL1 as a result of the failure. Referring to FIG. 4, the comparing unit 410 compares the test voltage transferred through the second word line WL2 with the reference voltage VREF. The driver 420 drives the output node OUT in response to the output signal of the comparator 410 and generates the detection signal DET at the output node OUT. The detection signal DET includes information on whether the first word line WL1 is improperly electrically coupled to the second word line WL2.

The storage unit 430 stores a voltage level at the output node OUT, where the voltage level represents the detection signal DET. The reset unit 440 resets the storage unit 430 in response to the reset signal RST. The reset signal RST is activated during an initial period of the test operation.

An embodiment of the semiconductor memory device may detect failure information regarding whether the word lines are improperly electrically coupled to each other, through the test operation.

Figure 5:
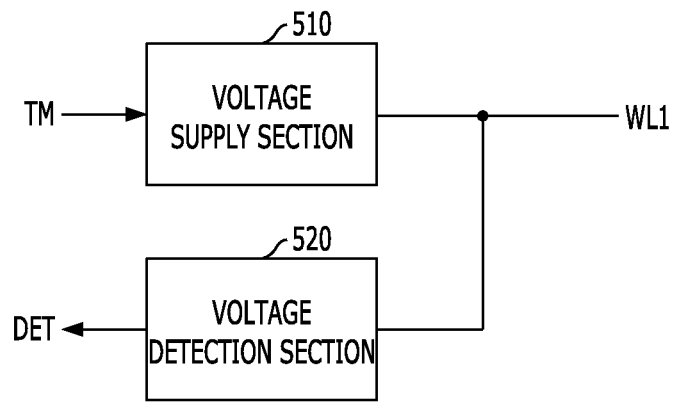
FIG. 5 is a block diagram representation of an embodiment of the word line failure detection unit shown in FIG. 2.

FIG. 5 is a block diagram representation of an embodiment of the word line failure detection unit 220 shown in FIG. 2. For convenience of description, the first word line WL1 is designated as a test target word line.

The failure detection unit 220 includes a voltage supply section 510 and a voltage detection section 520.

The voltage supply section 510 supplies a test voltage having a predefined voltage level to the test target word line, the first word line WL1, in response to a test signal TM. The test signal TM is activated during a test operation. The voltage detection section 520 detects a voltage level of the first word line WL1 and responsively generates a detection signal DET. The detection signal DET includes information on whether the first word line WL1 is electrically coupled to the second word line WL2.

The embodiment of the failure detection unit shown in FIG. 3 supplies the test voltage to the test target word line and then detects the test voltage through an adjacent word line. The embodiment of the failure detection unit 220 shown in FIG. 5 supplies the test voltage to the test target word line and then detects the test voltage of the test target word line.

Referring to FIG. 5, an example of an operation of the semiconductor memory device is described below.

The voltage supply section 510 supplies the test voltage to the first word line WL1 in response to the test signal TM during the test operation. After a predefined period of time, the voltage detection section 520 detects the voltage level of the first word line WL1 and responsively generates the detection signal DET. If the first word line WL1 is not electrically coupled to the other word lines, the voltage level of the first word line WL1 maintains a voltage level corresponding to an initial test voltage. If the first word line WL1 is electrically coupled to any of the other word lines as a result of a failure, the voltage level of the first word line WL1 is relatively lower. The voltage detection section 520 detects a voltage level of the first word line WL1 and responsively generates the detection signal DET, where the detection signal DET which includes information on whether first word line WL1 is improperly electrically coupled to the second word line WL2.

An embodiment of the semiconductor memory device may detect failure information regarding whether word lines are improperly electrically coupled to each other through the test operation.

Figure 6:
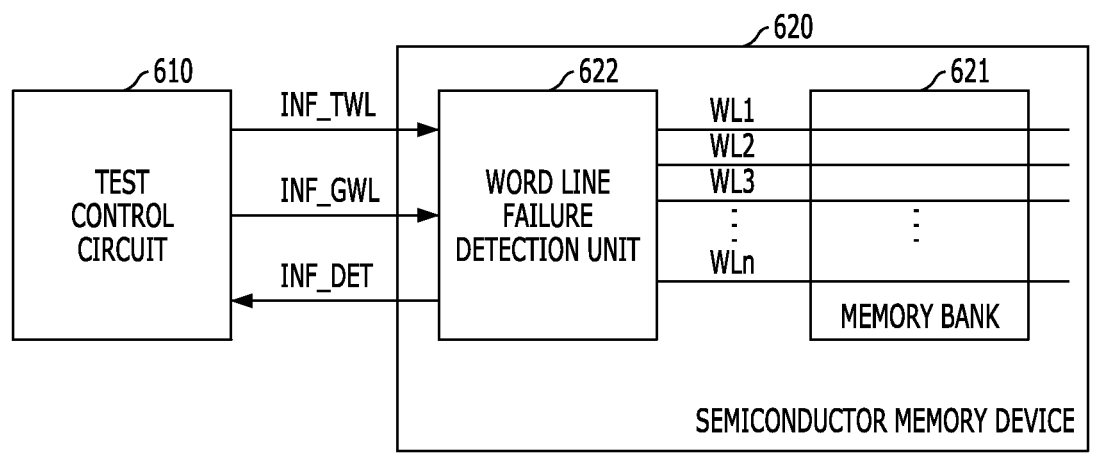
FIG. 6 is a block diagram representation of an embodiment of a test control system.

FIG. 6 is a block diagram representation of an embodiment of a test control system.

The test control system includes a test control circuit 610 and a semiconductor memory device 620.

The test control circuit 610 controls a test operation of a plurality of word lines WL1-WLn, where n is a nature number. The test control circuit 610 may designate two of the plurality of word lines WL1-WLn as first and second test target word lines during the test operation. The first test target word line is a word line that is supplied with a test voltage during the test operation, and the second test target word line is a word line that is used to detect the test voltage. The test control circuit 610 generates a first setting information signal INF_TWL corresponding to the first test target word line and a second setting information signal INF_GWL corresponding to the second test target word line. The test control circuit 610 transmits the first setting information signal INF_TWL and the second setting information signal INF_GWL to the semiconductor memory device 620.

The semiconductor memory device 620 includes a memory bank 621 and a word line failure detection unit 622. The memory bank 621 includes the plurality of word lines WL1, WL2-WLn. The test target word lines are selected from the plurality of word lines WL1-WLn during the test operation. The word line failure detection unit 622 supplies the test voltage to a first test target word line and detects the test voltage transferred via the plurality of word lines WL1-WLn in response to the first setting information signal INF_TWL and the second setting information signal INF_GWL. The first test target word line and the number of the first test target word lines are set by the first setting information signal INF_TWL. The second test target word lines and the number of the second test target word lines are set by the second setting information signal INF_GWL. The number of first and second test target word lines designated by the test control circuit 610 may vary depending on system design.

The test control circuit 610 receives failure detection information INF_DET from the word line failure detection unit 622. The test control circuit 610 may reset the first and second test target word lines and the number of the first and second test target word lines in response to the failure detection information INF_DET. The information relating to the reset first test target word lines and the reset number of first test target word lines are transmitted to the semiconductor memory device 620 via the first setting information signal INF_TWL. The information relating to the reset second test target word lines and the reset number of the second test target word lines are transmitted to the semiconductor memory device 620 via the second setting information signal INF_GWL.

An example of the operation of the test control system is described below.

In an example of a test operation described below, the number of the first test target word lines is set to one.

The word line failure detection unit 622 supplies the test voltage to the first test target word line. The first target test word line is designated by the first setting information signal INF_TWL. The test voltage is transferred through the second test target word lines. The number of second test target word lines is defined by the second setting information signal INF_GWL. The test voltage transmitted through the second test target word lines is detected by the word line failure detection unit 622. The word line failure detection unit 622 transmits the failure detection information signal INF_DET based on the detected test voltage to the test control circuit 610. The test control circuit 610 may re-set the first test target word lines and the second test target word lines in response to the failure detection information signal INF_DET. The number of the second test target word lines may be reset to a value that is different from the prior value of the number of the second test target word lines. For example, if the number of the second test target word lines was set to one during a first test operation, the number of the second test target word lines may be reset to two during a second test operation. When the number of the second test target word lines is set to one, the test voltage is transmitted through a word line adjacent to the first test target word line. When the number of the second test target word lines is set to two, the test voltage is transmitted through the two word lines adjacent to the first test target word line. In an example of a test operation described below, the number of the first test target word lines is set to two.

The word line failure detection unit 622 supplies the test voltage to the first test target word lines. The number of first test target word lines is designated by the first setting information signal INF_TWL received from the test control circuit 610. The number of first target word lines is set to two. The number of second test target word lines is defined by the second setting information signal INF_GWL received from the test control circuit. The test voltage is transferred through a plurality of word lines defined by the number of second test target word lines. The word line failure detection unit 622 detects the test voltage through the plurality of word lines and generates the failure detection information signal INF_DET based on the detected test voltage. The word line failure detection unit 622 transmits the failure detection information signal INF_DET to the test control circuit 610. The test control circuit 610 may analyze the received the failure detection information signal INF_DET to determine whether an improper electrical coupling has occurred between one or more of the plurality of word lines. Further analysis may be performed by supplying test voltages having a different voltage levels to each of the first test target word lines. For example, test voltages having values of 3V and 5V may be applied to each of the first test target word lines. The test voltages may be detected through the plurality of word lines. An embodiment of the semiconductor memory device may detect failure information associated with improper electrical coupling that may occur between one or more of the word lines of the semiconductor memory device. Repairs may be made to the word line based on the detected failure information.

While a non-volatile memory device, a flash memory device, has been used to describe various embodiments of a semiconductor memory device and a test control circuit, in alternative embodiments, the semiconductor memory device may be a non-volatile memory device. Alternative embodiments may be include the testing of a circuit comprising a plurality of transmission lines. While the described embodiments define a configuration where the word line failure detection unit 622 is disposed within the semiconductor memory device 620, the word line failure detection unit 622 may be disposed outside the semiconductor memory device 620.

While one or more configurations of logic gates and transistors have been described above, alternative configurations of logic gates and transistors may be used to implement the test control circuit 610 and the word line failure detection unit 622.

Figure 7:
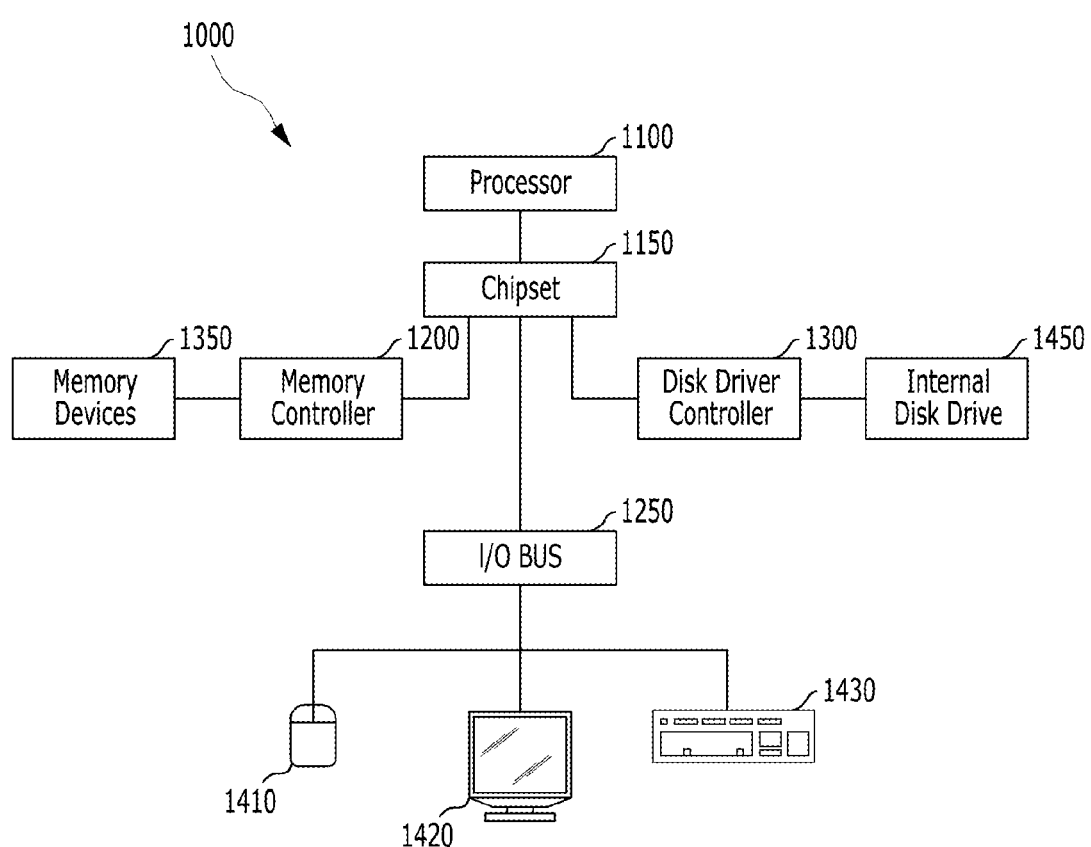
FIG. 7 is a block diagram representation of a system including an embodiment of a test control circuit and a semiconductor memory device including an embodiment of a word line failure detection unit.

Referring to FIG. 7, a block diagram representation of a system 1000 including an embodiment of a semiconductor memory device 1350 is shown. In an embodiment, the semiconductor memory device 1350 is substantially similar to the semiconductor memory device shown in FIG. 2. In an embodiment, the system includes an embodiment of a test control circuit.

In an embodiment, a semiconductor memory device may include a plurality of memory cells electrically coupled to a plurality of word lines, and a word line failure detection unit suitable for supplying a test voltage to a test target word line selected from among the plurality of word lines, and for detecting the test voltage through at least one of the plurality of word lines, wherein the at least one of the plurality of word lines does not include the test target word line.

In an embodiment, a test control system may include a semiconductor memory device and a test control circuit. The semiconductor memory device may include a memory bank including a plurality of word lines and a word line failure detection unit suitable for supplying a test voltage to at least one first test target word line from among the plurality of word lines, and for detecting the test voltage through at least one second test target word line from among the plurality of word lines. The test control circuit may be suitable for selecting the at least one first test target word line and the at least one second test target word line.

In an embodiment, a method of operating a test control system may include supplying first and second test voltages to at least two test target word lines selected from among a plurality of word lines, detecting the first and second test voltages through the plurality of word lines, and obtaining failure information on a status of electrical coupling between at least two of the plurality of word lines based on the detected first and second test voltages.

Examples of the semiconductor memory device 1350 include, but are not limited to, dynamic random access memory, static random access memory, synchronous dynamic random access memory (SDRAM), synchronous graphics random access memory (SGRAM), double data rate dynamic ram (DDR), and double data rate SDRAM.

The memory controller 1200 is used in the design of memory devices, processors, and computer systems. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented A chipset 1150 may be electrically coupled to the CPU 1100. The chipset 1150 is a communication pathway for signals between the CPU 1100 and other components of the system 1000, which may include the memory controller 1200, an input/output ("I/O") bus 1250, and a disk drive controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be electrically coupled to the chipset 1150. The memory controller 1200 can receive a request provided from the CPU 1100, through the chipset 1150. In alternate embodiments, the memory controller 1200 may be integrated into the chipset 1150. The memory controller 1200 may be electrically coupled to one or more memory devices 1350. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 may also be electrically coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

The system 1000 described above in relation to FIG. 7 is merely one example of a system employing a semiconductor memory device 1350. In alternate embodiments, such as cellular phones or digital cameras, the components may differ from the embodiment shown in FIG. 7.

While certain embodiments have been described above, it will be understood to those skilled in the art that the embodiments described are by way of example only. Accordingly, the semiconductor memory device system described herein should not be limited based on the described embodiments. Rather, the semiconductor memory device system described herein should only be limited in light of the claims that follow when taken in conjunction with the above description and accompanying drawings.

What is claimed is:

1. A semiconductor memory device comprising:
   a plurality of memory cells electrically coupled to a plurality of word lines; and
   a word line failure detection unit suitable for supplying a test voltage to a test target word line selected from among the plurality of word lines, and for detecting the test voltage transferred from at least one of the plurality of word lines, wherein the at least one of the plurality of word lines except for the test target word line,
   wherein the word line failure detection unit comprises:
   a voltage supply section suitable for supplying the test voltage to the test target word line; and
   a voltage detection section suitable for detecting the test voltage transferred through the at least one of the plurality of word lines,
   wherein the word line failure detection unit is suitable for:
   supplying the test voltage to the test target word line,
   detecting the test voltage through the at least one of the plurality of word lines,
   generating a detection signal based on the detected test voltage, and
   obtaining failure information associated with the plurality of word lines in response to the detection signal.

2. A test control system comprising:
   a semiconductor memory device comprising:
   a memory bank including a plurality of word lines;
   a word line failure detection unit suitable for supplying a test voltage to at least one first test target word line from among the plurality of word lines, and for detecting the test voltage through at least one second test target word line from among the plurality of word lines; and a test control circuit suitable for selecting the at least one first test target word line and the at least one second test target word line, wherein the word line failure detection unit comprises:
a voltage supply section suitable for supplying the test voltage to the at least one first test target word line; and
a voltage detection section suitable for detecting the test voltage through the at least one second test target word line, wherein the at least one first test target word line is different from the at least one second test target word line, and the word line failure detection unit is suitable for:
supplying the test voltage to the at least one first test target word line;
detecting the test voltage through the at least one second test target word line; and
obtaining failure information on a status of electrical coupling between least two of the plurality of word lines in response to the detected test voltage.

3. The test control system of claim 2, wherein the test control circuit is suitable for selecting the at least one first test target word line and the at least one second test target word line based on the failure information.

4. The test control system of claim 2, wherein the test control circuit is suitable for determining a number of word lines in the at least one first test target word line and the at least one second test target word line based on the failure information.

5. A semiconductor memory device comprising:
a plurality of memory cells electrically coupled to a plurality of word lines; and
a word line failure detection unit suitable for supplying a test voltage to a test target word line selected from among the plurality of word lines, and for detecting the test voltage transferred from at least one of the plurality of word lines, wherein the at least one of the plurality of word lines except for the test target word line, wherein the word line failure detection unit comprises:
a voltage supply section suitable for supplying the test voltage to the test target word line; and
a voltage detection section suitable for detecting a voltage level of the test target word line, wherein the word line failure detection unit is suitable for:
supplying the test voltage to the test target word line,
detecting the voltage level of the test target word line after a predefined period of time,
generating a detection signal based on the detected voltage level, and
obtaining failure information associated with a status of electrical coupling between two or more of the plurality of word lines in response to the detection signal.

6. The test control system of claim 5, wherein the test control circuit is suitable for determining a number word lines in the at least one first test target word line and the at least one second test target word line based on the failure information.

7. A test control system comprising:
a semiconductor memory device comprising:
a memory bank including a plurality of word lines;
a word line failure detection unit suitable for supplying a test voltage to at least one first test target word line from among the plurality of word lines, and for detecting the test voltage through at least one second test target word line from among the plurality of word lines; and
a test control circuit suitable for selecting the at least one first test target word line and the at least one second test target word line, wherein the at least one first test target word line is substantially similar to the at least one second test target word line, and the word line failure detection unit is suitable for:
supplying the test voltage to the at least one first test target word line;
detecting a voltage level of the at least one second test target word line after a predefined period of time; and
obtaining failure information on a status of electrical coupling connection between at least two of the plurality of word lines based on the detected voltage level.

8. The test control system of claim 7, wherein the test control circuit is suitable for resetting the at least one first test target word line and the at least one second test target word line based on the failure information.

* * * * *